(12) United States Patent
Weber et al.

(10) Patent No.: US 7,102,078 B2
(45) Date of Patent: Sep. 5, 2006

(54) HOUSING FOR HOLDING ELECTRICAL AND/OR ELECTRONIC COMPONENTS

(75) Inventors: Michael Weber, Meckenbeuren (DE); Wolfgang Heinrich, Tettnang (DE); Andreas Hornstein, Lindau (DE); Wolfgang Mehnert, Lindau (DE); Franz Sauter, Tettnang (DE); Ralf Siegler, Schlier (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 11/159,385

(22) Filed: Jun. 23, 2005

(65) Prior Publication Data

US 2005/0287864 A1    Dec. 29, 2005

(30) Foreign Application Priority Data

Jun. 24, 2004   (DE) ...................... 10 2004 030 666

(51) Int. Cl.
    *H02G 3/08*    (2006.01)
(52) U.S. Cl. .............................. 174/50; 174/58; 174/54; 174/65 R; 174/64; 248/278.1
(58) Field of Classification Search .................. 174/50, 174/58, 65 R, 54, 61, 64; 220/3.2, 3.3, 3.6, 220/4.02; 248/906, 278.1; 439/535
See application file for complete search history.

(56) References Cited

U.S. PATENT DOCUMENTS

| 3,096,654 | A |   | 7/1963  | Du Bois |            |
|-----------|---|---|---------|---------|------------|
| 4,467,136 | A | * | 8/1984  | Wium    | 174/50     |
| 4,886,938 | A |   | 12/1989 | Rottmar et al. | |
| 5,616,887 | A |   | 4/1997  | Kirma   |            |
| 5,663,525 | A | * | 9/1997  | Newman  | 174/50     |
| 5,810,307 | A | * | 9/1998  | Odum    | 248/278.1  |
| 6,617,513 | B1 | * | 9/2003 | Wu      | 174/65 R   |
| 6,875,919 | B1 | * | 4/2005 | Hsieh   | 174/50     |

FOREIGN PATENT DOCUMENTS

| DE | 197 18 392 A1 | 11/1998 |
| DE | 199 52 643 C1 | 3/2001 |
| DE | 101 19 910 C1 | 8/2002 |
| EP | 0 186 821 A1 | 7/1986 |

\* cited by examiner

Primary Examiner—Dhiru R. Patel
(74) Attorney, Agent, or Firm—David S. Safran

(57) ABSTRACT

A housing for holding electrical and/or electronic components with a housing opening and with an entry fitting which is rotationally located in the housing opening, the entry fitting having a cylindrical holding part in which an annular groove is formed, and being held by a fastener in the housing. In the housing, the entry fitting can be securely attached to the housing with simple means and installation of the entry fitting, with the housing otherwise closed, is possible in that, for axially securing the entry fitting in the housing opening, there is an open plastic snap ring which is provided with a feed bevel which is guided in the annular groove, and which, in the installed state of the entry fitting, is locked at least partially in a groove in the housing opening.

18 Claims, 4 Drawing Sheets

HOUSING FOR HOLDING ELECTRICAL AND/OR ELECTRONIC COMPONENTS

BACKGROUND OF THE INVENTION

1. Filed of Invention

The invention relates to a housing for holding electrical and/or electronic components, with a housing opening and with an entry fitting which is rotationally located in the housing opening, the entry fitting having a cylindrical holding part in which an annular groove is formed, and being held by a fastener in the housing. In addition, the invention relates to an entry fitting for rotary arrangement in the opening of a housing of an electrical or electronic device, especially an optical, inductive or capacitive proximity switch.

2. Description of Related Art

The initially described housing can be especially the housing of a sensor, for example, of an inductive, capacitive or optical proximity switch. Within the housing, there are the actual sensor element and other electrical and electronic components, for example, an evaluation circuit. For electrical connection to other devices, for example, a central control, the housing has an entry fitting which is used as a cable or plug outlet.

Such a housing is known for example from German Patent DE 197 18 392 C2. In the known housing, the entry fitting has a snap projection with a slotted locking bead, using which the entry fitting can be locked in the housing opening. In addition to this snap connection, on the housing, there are undercuts and on the entry fitting, there are stabilization shoulders which can be caused to engage the undercuts and which are made complementary to the undercuts. The execution of the undercuts and the stabilization shoulders which additionally connect the entry fitting and the housing to one another results in that the forces acting on the entry fitting no longer need be accommodated solely by the snap connection.

In order to prevent unintentional detachment of the entry fitting from the housing opening, it is moreover provided that, from the housing interior, a cylindrical blocking element is placed in the snap projection, by which it is ensured that the locking bead of the snap projection cannot move radially to the inside, by which detachment of the snap connection would occur. By the above described measure, the entry fitting can be securely anchored to the housing, but for this reason, a very special execution both of the housing and also of the entry fitting is necessary.

Another housing of the initially described type is known from German Patent DE 199 52 643 C1. In this housing, an entry fitting can also be selectively attached in different positions in the housing opening. Here, the housing opening is made as a hub hole, and the entry fitting can be fixed by means of a locking clip which is integrated on the housing cover and/or on the housing bottom. The locking clips have catch hooks, by means of which the entry fitting can be fixed in different rotary positions. The approach described in German Patent DE 199 52 643 C1 also requires a special configuration of the housing, especially of the housing cover and/or of the housing bottom.

Finally, German Patent DE 101 19 910 C1 discloses a housing with an entry fitting which is located to be able to turn in the housing opening, in which to fix the entry fitting in a first or a second rotary position, there is an insertion part which is fixed in the housing interior, with an insert, the insert being surrounded by the cylindrical holding part of the entry fitting, and there being catch means which interact on the holding part and the insert.

It is common to all known housings that the catching and fixing of the entry fitting in the housing opening must take place with an at least partially opened housing, i.e., the housing can only be closed after installation of the entry fitting. If the housing, as stated initially, is the housing of a proximity switch, based on the conditions of use of the proximity switch, it is often necessary for the proximity switch to be potted for protection of the electrical and electronic components which are located in the housing. However, potting of a proximity switch is, of course, only possible when all electrical and electronic components are located in the housing and the housing, except for an opening for adding the potting resin, is sealed. Therefore, in the known housings, installation of the electrical and electronic components, and especially the potting of the housing, are possible only after installation of the entry fitting.

Due to the plurality of different proximity switch versions which are used in practice, there is a requirement for making the proximity switch as modular as possible in order to reduce the number of the proximity switches kept in a warehouse. For example, otherwise identical proximity switches can differ only in that they have a plug outlet, a cable outlet or a terminal space for the wires of an electrical cable. To do this, differently made entry fittings are necessary. In a modular structure of the actual housing and of the entry fitting, the two components could be produced and stored separately from one another, and accordingly, assembled only when necessary.

SUMMARY OF THE INVENTION

Therefore, a primary object of this invention is to make a housing of the initially described type such that the entry fitting can be securely attached to the housing with means as simple as possible. In addition, mounting of the entry fitting on the housing should, as much as possible, enable modular production of the housing and the entry fitting.

The aforementioned object is achieved in the initially described housing for holding electrical and/or electronic components in that, for axially securing the entry fitting in the housing opening, there is an open plastic snap ring which is provided with a feed bevel, which is guided in the annular groove of the entry fitting, and which, in the installed state of the entry fitting, is locked at least partially in a groove in the housing opening. Because a plastic snap ring with a feed bevel is used as the fastener, the entry fitting with the snap ring mounted, due to the radial spring action of the plastic snap ring—with the housing otherwise closed—can be inserted from the outside through the housing opening. Since the snap ring then locks in the groove which is made in the housing opening, the arrangement of an additional locking element from the housing interior is not necessary, so that the housing, except for the housing opening for accommodating the entry fitting, can be completely closed when the entry fitting is installed.

The attachment of the entry fitting in the housing opening in accordance with the invention, thus, makes it possible to mount a sensor already finished, and if necessary, also to pot it, so that an electrical operating test of the sensor can also be run before the housing is connected to the entry fitting. If the sensor is potted, the housing opening can be used as the fill opening for the potting resin. The configuration of the housing of the invention thus enables an electronic device, for example, a proximity switch, to be made modular, i.e., storage of the housing with the electrical and electronic components completely assembled, potted and electrically tested, and only when necessary, providing the housing with a corresponding entry fitting which is made, for example, as a cable terminal or as a plug terminal.

According to one preferred configuration of the invention, the profile of the snap ring is made such that the snap ring, in the relieved state, on its side facing the housing, has a smaller diameter and on its side facing away from the housing, has a larger diameter, than the housing opening which is intended for accommodating the entry fitting. This dimensioning of the snap ring, in conjunction with the feed bevel which preferably has an angle of 25°–45° relative to the center axis of the snap ring, on the one hand, enables relatively simple insertion of the holding part of the entry fitting into the housing opening, but on the other hand, also ensures secure fixing of the entry fitting in the housing.

To increase the tightness of the connection between the housing and the entry fitting, in the holding part and/or in the housing opening, at least one other annular groove for holding a gasket is made. Preferably, both in the holding part and also in the housing opening, there is a respective annular groove so that double sealing can be accomplished and thus 1-fault tolerance is guaranteed.

To limit the maximum rotary motion of the entry fitting in the housing opening, in the front of the entry fitting facing the housing, only a partially peripheral groove is made and on the side of the housing facing the entry fitting, a corresponding projection is made. If the entry fitting with its holding part is inserted into the housing opening, the projection which has been molded on the housing fits into the groove which is made on the entry fitting. Because the groove runs only partially around, preferably about 270°, the motion of the entry fitting is limited to rotations of a maximum 270° by the interaction of the projection with the groove.

It was stated initially that the snap ring is made of a plastic, by which the snap ring, in contrast to a metal snap ring, has sufficient elasticity so that the holding part of the entry fitting, with the snap ring inserted, can be pressed into the housing opening without a tool being necessary for compressing the snap ring. Preferably, not only the snap ring, but also moreover the entry fitting and the housing are made of plastic. This enables economical production both of the entry fitting and also of the housing. In addition, the corresponding matching of the material properties of the plastic used for the housing, the entry fitting and snap ring can prevent damage to the housing, entry fitting or snap ring when the entry fitting is locked into the housing opening. Preferably, for this reason, at least the entry fitting and the snap ring are made of the same plastic, especially PEEK (polyether ether ketone) or PPS (polyphenyl sulfide). However, moreover, other plastics which are matched to the respective applications can also be used.

As initially stated, the invention relates, in addition to a housing with an entry fitting, also to the entry fitting for rotational arrangement in the opening of the housing of an electrical or electronic component itself. According to this aspect of the invention, the entry fitting which has a cylindrical holding part with an annular groove and a base body is has an open plastic snap ring which is provided with a feed bevel in the annular groove for axially securing the entry fitting in the housing opening. In the installed state of the entry fitting, the snap ring locks partially in a groove in the housing opening.

With respect to the advantages which can be achieved with such an entry fitting and with respect to the advantageous configuration of such an entry fitting, reference is made to the previous statements in conjunction with the housing.

In particular, there is a host of possibilities for embodying and developing the housing as claimed in the invention and the entry fitting in accordance with the invention. In this regard, reference is made to the description below of a preferred embodiment in conjunction with the accompanying drawings.

DETAILED DESCRIPTION OF THE INVENTION

Figure 1:
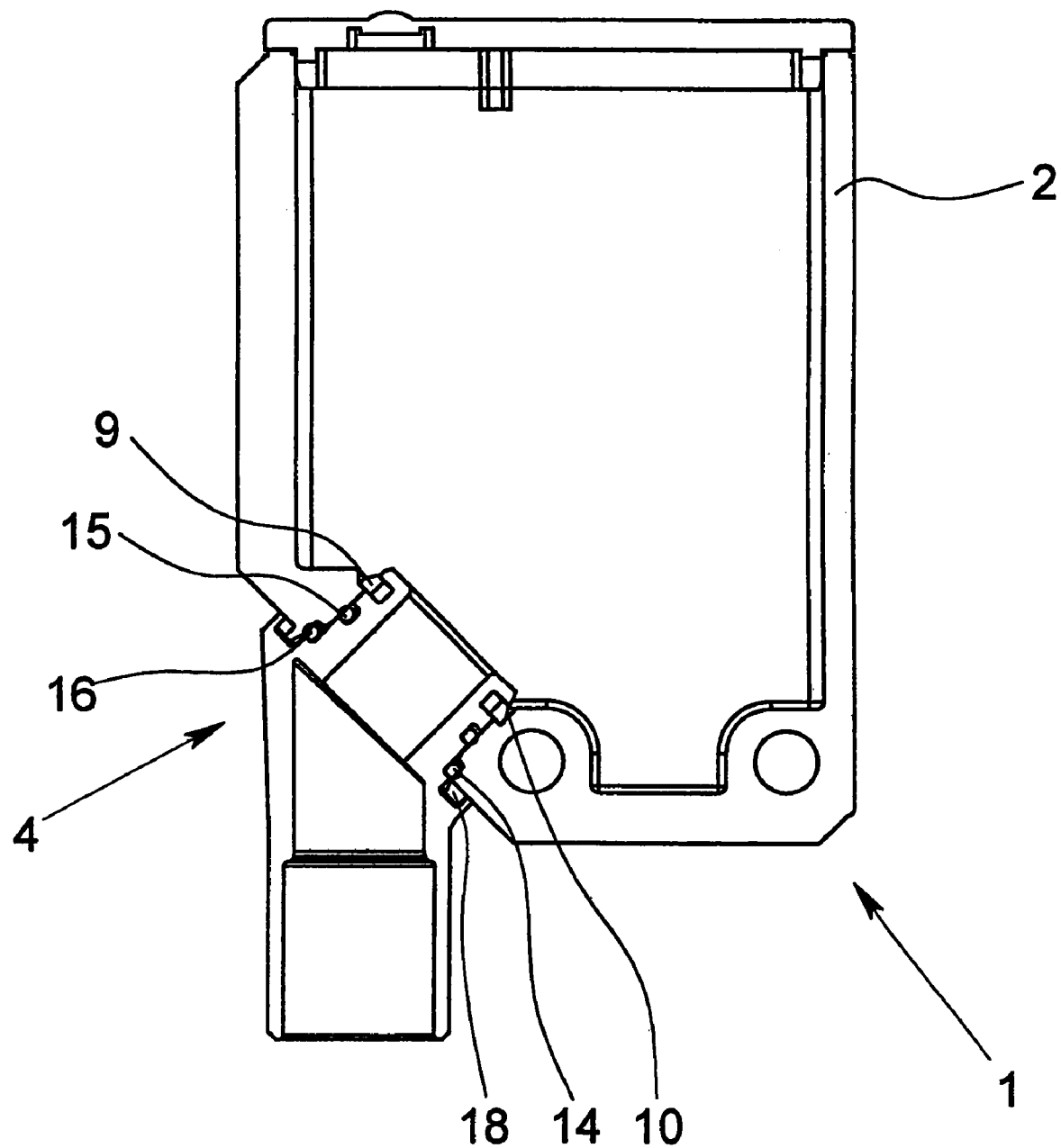
FIG. 1 shows a housing in accordance with the invention with the entry fitting locked in, in a section.
Figure 2:
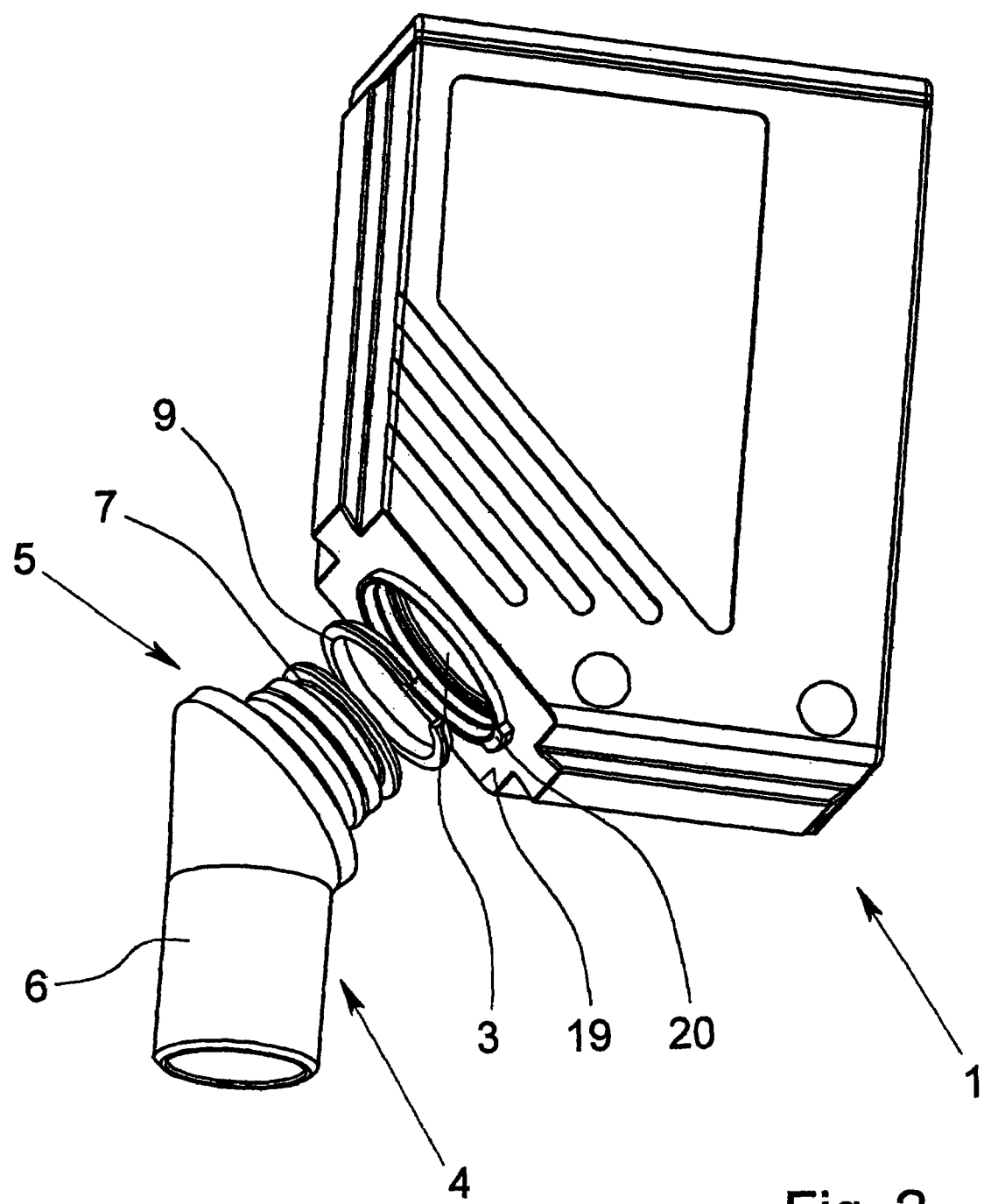
FIG. 2 is a perspective view of the housing, the entry fitting and the snap ring, in the still uninstalled state.

FIGS. 1 & 2 show a proximity switch 1 with a housing 2 for holding electrical and electronic components. In the housing 2, there is a housing opening 3 which is used for holding an entry fitting 4. The entry fitting 4 has a holding part 5 which is locked within the housing opening 3 in the mounted state, and a cylindrical base body 6, the lengthwise axis of the holding part 5 and the lengthwise axis of the base body 6, in this embodiment, being at an angle of 135° relative to one another. Of course, the lengthwise axis of the holding part 5 and the lengthwise axis of the base body 6 can also coincide and can have a different angle relative to one another.

Figure 4A:
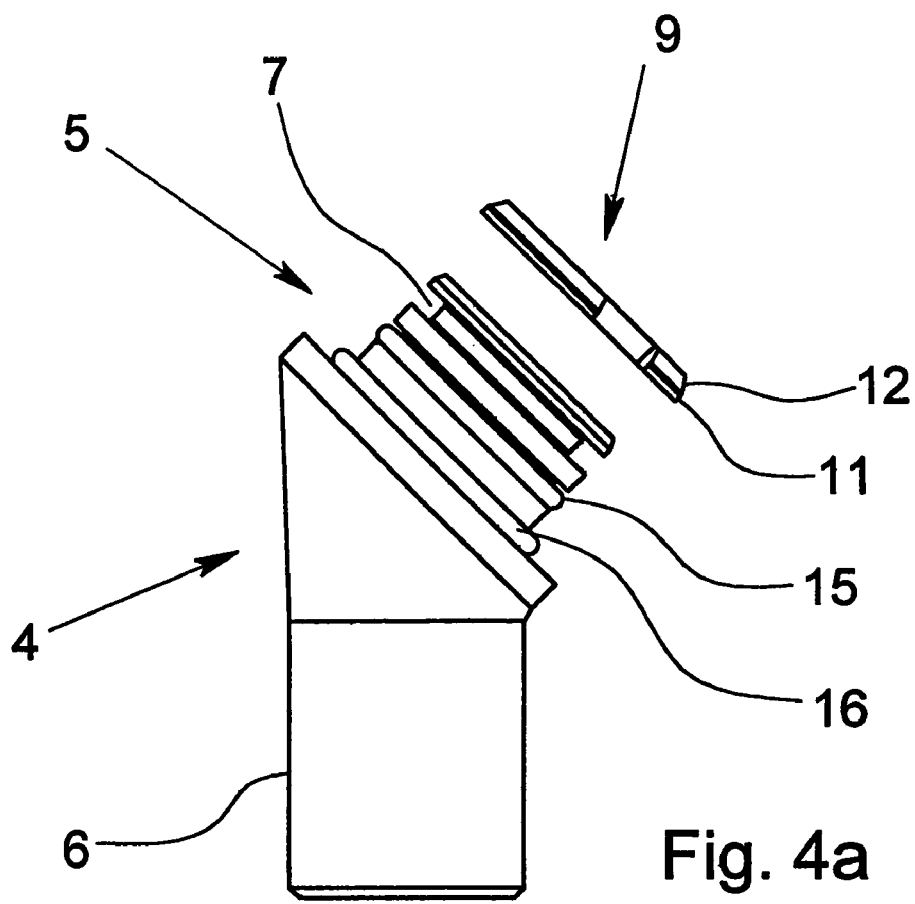
FIGS. 4a & 4b show the entry fitting with a separate snap ring and with the snap ring inserted in an annular groove, respectively.
Figure 4B:
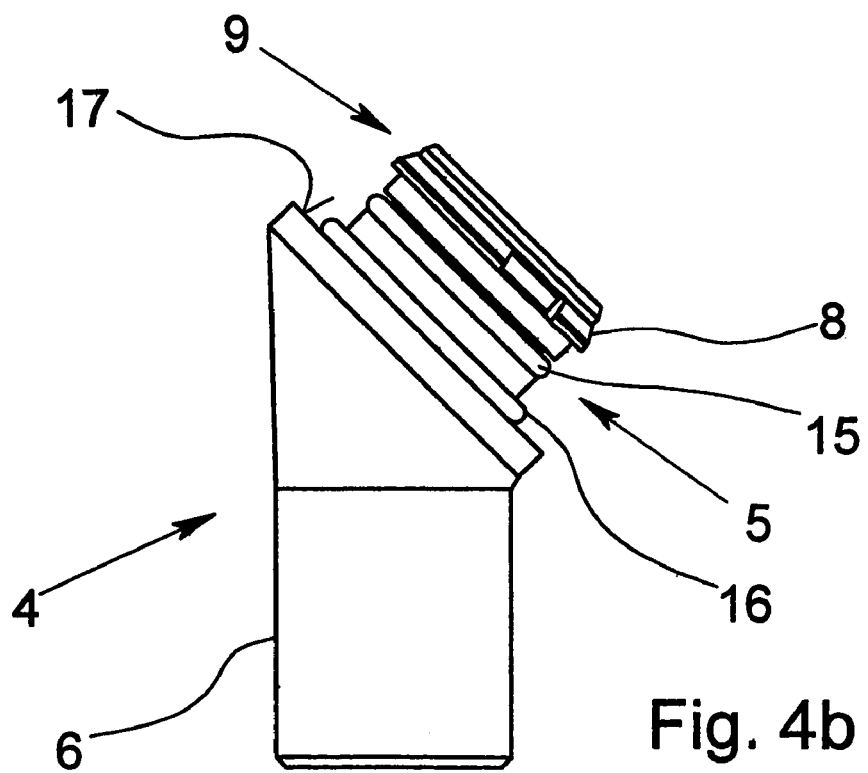

To axially secure the entry fitting 4 in the opening 3 of the housing 2, in the annular groove 7 which is made in the holding part 5, there is a fastener in the form of a snap ring 9 which is provided with an feed bevel 8 (see, FIG. 4b). The snap ring 9, like the entry fitting 4, is made of plastic, at least for the entry fitting 4 and the snap ring 9, a plastic with similar material properties, especially with respect to hardness and the modulus of elasticity, being used. In the installed state of the entry fitting 4, the snap ring 9 is locked partially in a groove 10 in the housing opening 3, by which the entry fitting 4 is attached to the housing 2 in a manner that is axially fixed, but still able turn.

The entry fitting 4 is dimensioned such that, in the relieved state, on its side facing the housing 2, it has a smaller diameter and on its side facing away from the housing 2, a larger diameter than the housing opening 3 which is intended to hold the entry fitting 4. In particular, FIGS. 3 & 4a, which show the entry fitting 4, illustrate that the profile of the snap ring 9 is composed of a rectangular area 11 and a triangular area 12 which adjoins it. The feed bevel 8 which is formed by the triangular area 12 has an angle of roughly 30° to the middle axis of the snap ring 9. At a maximum outside diameter of the snap ring 9 of roughly 10 to 15 mm and a height of the snap ring 9 of roughly 1.0 to 1.5 mm, the outside diameter of the snap ring 9 on its side facing the housing 2 in the relieved state is roughly 2 mm smaller than the maximum outside diameter. This difference between the maximum and the minimum outside diameter of the snap ring 9 together with the entry bevel 8 is enough to enable, on the one hand, the holding part 5 with the snap ring 9 located in the annular groove 7 to be pressed into the housing opening 3 with relatively little expenditure of force, but at the same time ensures sufficient axial fixing of the entry fitting 4 on the housing 2.

Figure 3:
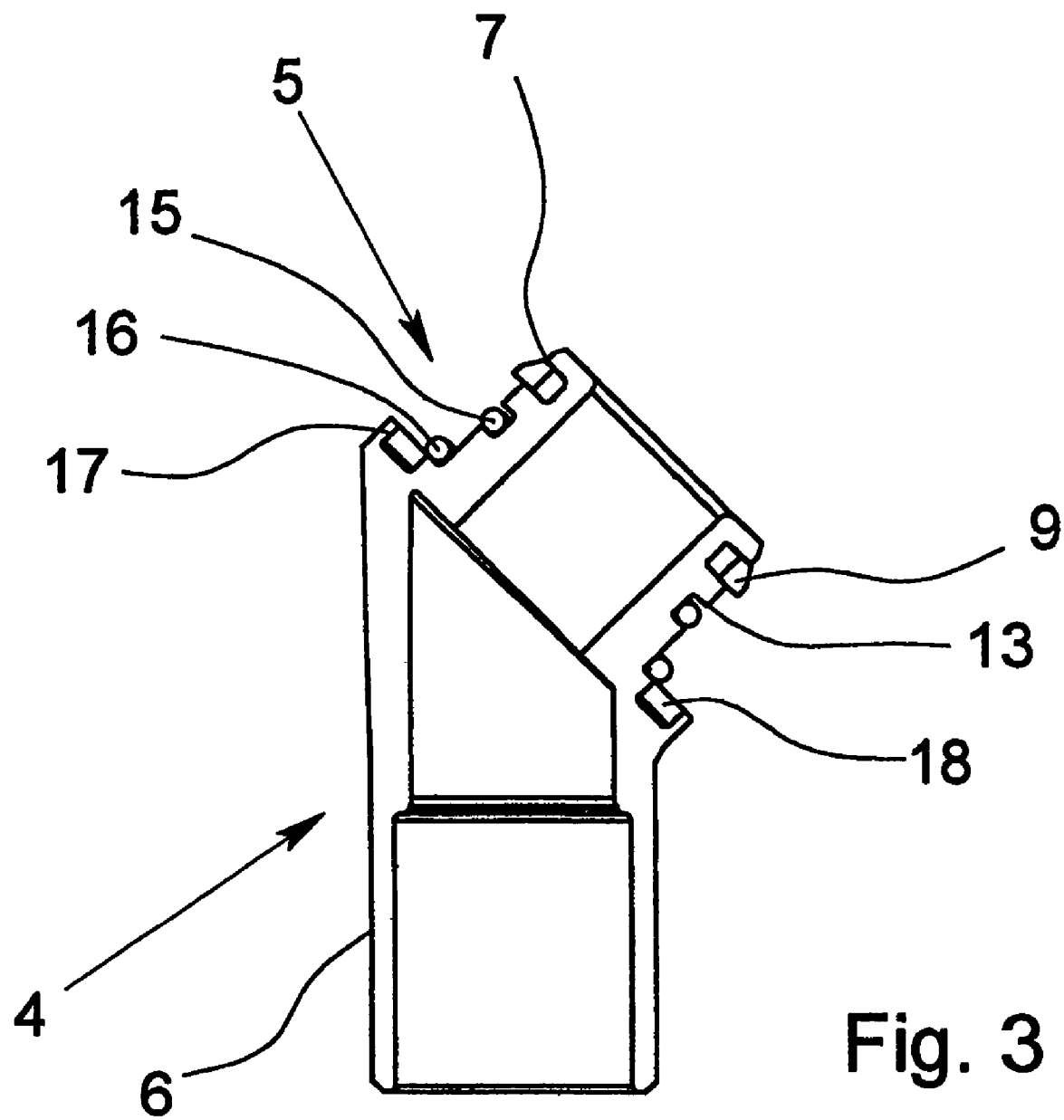
FIG. 3 shows the entry fitting in a section.

In particular, FIGS. 1–3 together show that, both in the housing opening 3 and also on the holding part 5 of the entry fitting 4, another annular groove 13, 14 for holding the gasket 15, 16 is formed. In the illustrated housing 2, there is thus a double seal between the housing opening 3 and the entry fitting 4, by which the housing 2 satisfies the requirements for a 1-fault tolerance.

Looking at FIGS. 1–3 together also shows, moreover, that in the front 17 of the entry fitting 4 facing the housing 2, only a partially peripheral groove 18 is made, and on the side 19 of the housing 2 facing the entry fitting 4, a corresponding projection 20 is made. In this way, the maximum possible rotary motion of the entry fitting 4 in the housing opening 3 is limited. Of course, it is also possible here to provide a corresponding groove in the housing 2 and a corresponding projection on the front 17 of the entry fitting 4.

Depending on the application, the entry fitting 4 can be made as a cable or plug outlet. If the entry fitting 4 is made as a plug outlet, in the base body 6 of the entry fitting 4, there are the corresponding contact pins which can be connected to the corresponding jacks of a connector. Instead of contact pins, in the base body 6 there can, of course, also be jacks so that the entry fitting 4 constitutes a jack outlet. However, likewise, the base body 6 of the entry fitting 4 can also be made as a terminal space for the wires of an electrical cable. In the base body 6, then, there are the corresponding contact elements which are used for electrical contact-making of the wires of a cable which is to be connected.

What is claimed is:

1. Housing for holding at least one of electrical and electronic components, comprising:
   a housing opening,
   an entry fitting which is rotationally located in the housing opening, the entry fitting having a cylindrical holding part in which an annular groove is formed, and
   a fastener for axially securing the entry fitting in the housing opening, the fastener comprising an open plastic snap ring which is provided with a feed bevel, which is guided in the annular groove, and which, in the installed state of the entry fitting, is locked at least partially in a groove in the housing opening.

2. Housing as claimed in claim 1, wherein the snap ring has a profile which, in a relieved state has a smaller diameter than the housing opening which is intended for accommodating the entry fitting on a side facing the housing and has it has a larger diameter than the housing opening on a side facing away from the housing.

3. Housing as claimed in claim 2, wherein the profile of the snap ring is composed of a rectangular area and a triangular area.

4. Housing as claimed in claim 1, wherein the feed bevel has an angle α of from 25° to 45° relative to a central axis of the housing opening.

5. Housing as claimed in claim 1, wherein the feed bevel has an angle α of roughly 30° relative to a central axis of the housing opening.

6. Housing as claimed in claim 1, wherein, in at least one of a holding part of the entry fitting and the housing opening, at least a second annular groove is provided for holding a gasket.

7. Housing as claimed in claim 1, wherein in the front of the entry fitting, facing the housing a partially peripheral groove is provided and on the side of the housing facing the entry fitting, a corresponding projection is provided.

8. Housing as claimed in claim 1, wherein the entry fitting is made of plastic.

9. Housing as claimed in claim 8, wherein the housing is made of plastic.

10. Housing as claimed in claim 9, wherein the entry fitting and the snap ring are made of a plastic material.

11. Housing as claimed in claim 10, wherein the entry fitting, the snap ring and the housing are made of the same plastic.

12. Housing as claimed in claim 10, wherein said plastic is selected from the group consisting of polyamide, polyether ether ketone, PPS polyphenyl sulfide, polybutylene terephthalate, polyphenylene ether, polyphenylene oxide, or polytetrafluoroethylene.

13. Entry fitting for rotational arrangement in a housing opening of a housing of an electrical or electronic device, comprising:
    a cylindrical holding part having an annular groove, and
    a base body,
    wherein, for axially securing the entry fitting in the housing opening, an open plastic snap ring with a feed bevel is provided, the snap ring being adapted for locking partially in a groove in the housing opening in the installed state of the entry fitting.

14. Entry fitting as claimed in claim 13, wherein the feed bevel has an angle α of from 25° to 45° relative to a central axis thereof, and wherein the snap ring has a profile that has a profile that has a rectangular area and a triangular area.

15. Entry fitting as claimed in claim 13, wherein the feed bevel has an angle α of 30°.

16. Entry fitting as claimed in claim 13, further comprising a holding part having a least an annular gasket groove for holding a gasket, and wherein a peripheral groove is provided in the front of the entry fitting, which in use faces the housing, said peripheral groove running only partially around the entry fitting.

17. Entry fitting as claimed in claim 16, wherein said peripheral groove runs around the entry fitting for about 270°.

18. Entry fitting as claimed in claim 13, wherein the base body and the snap ring are made of the same plastic.

* * * * *